US010211066B2

(12) United States Patent
Katano (10) Patent No.: US 10,211,066 B2
(45) Date of Patent: Feb. 19, 2019

(54) SILICON EPITAXIAL WAFER AND METHOD OF PRODUCING SAME (71) Applicant: SUMCO CORPORATION, Tokyo (JP)

(72) Inventor: Tomokazu Katano, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 0 days.

(21) Appl. No.: 15/564,952

(22) PCT Filed: Apr. 21, 2016

(86) PCT No.: PCT/JP2016/062662
§ 371 (c)(1),
(2) Date: Oct. 6, 2017

(87) PCT Pub. No.: WO2016/181787
PCT Pub. Date: Nov. 17, 2016

(65) Prior Publication Data
US 2018/0108538 A1 Apr. 19, 2018

(30) Foreign Application Priority Data

May 8, 2015 (JP) ................................. 2015-095604

(51) Int. Cl.
B28D 1/08 (2006.01)
H01L 21/02 (2006.01)
(Continued)

(52) U.S. Cl.
CPC ............ H01L 21/3225 (2013.01); B28D 1/08 (2013.01); C30B 15/00 (2013.01); C30B 15/203 (2013.01);
(Continued)

(58) Field of Classification Search
None
See application file for complete search history.

(56) References Cited

U.S. PATENT DOCUMENTS 6,162,708 A    12/2000  Tamatsuka et al.
7,582,357 B2 *  9/2009  Koike ..................... C30B 15/00
                                                 117/951
(Continued)

FOREIGN PATENT DOCUMENTS

CN    101024895 A    8/2007
JP    2004-304095 A  10/2004
(Continued)

OTHER PUBLICATIONS

International Search Report for PCT/JP2016/062662, dated Jun. 21, 2016.
(Continued)

Primary Examiner — Shaun M Campbell
(74) Attorney, Agent, or Firm — Greenblum & Bernstein, P.L.C.

(57) ABSTRACT

A silicon single crystal is pulled up such that nitrogen concentration of the crystal is $1 \times 10^{11}$ to $2 \times 10^{13}$ atoms/cm$^3$, the crystal cooling rate is about 4.2° C./min at a temperature of a silicon melting point to 1350° C. and is about 3.1° C./min at a temperature of 1200° C. to 1000° C., and oxygen concentration of a wafer is $9.5 \times 10^{17}$ to $13.5 \times 10^{17}$ atoms/cm$^3$. After a heat treatment is performed on the wafer sliced from the silicon single crystal in a treatment condition of 875° C. for about 30 min, growth of an epitaxial layer is caused. Thus, an epitaxial wafer in which the number of epitaxial defects is not increased while maintaining predetermined oxygen concentration and slips do not occur is produced.

4 Claims, 3 Drawing Sheets (51) Int. Cl.
*H01L 29/16* (2006.01)
*H01L 29/34* (2006.01)
*H01L 21/322* (2006.01)
*C30B 15/00* (2006.01)
*C30B 15/20* (2006.01)
*C30B 25/18* (2006.01)
*C30B 29/06* (2006.01)
*C30B 33/02* (2006.01)

(52) U.S. Cl.
CPC .............. *C30B 25/18* (2013.01); *C30B 29/06* (2013.01); *C30B 33/02* (2013.01); *H01L 21/0262* (2013.01); *H01L 21/02381* (2013.01); *H01L 21/02532* (2013.01); *H01L 21/02658* (2013.01); *H01L 29/16* (2013.01); *H01L 29/34* (2013.01)

(56) References Cited

U.S. PATENT DOCUMENTS

| | | | |
|---|---|---|---|
| 2001/0037761 A1* | 11/2001 | Ries | C23C 16/0227 117/200 |
| 2002/0017234 A1 | 2/2002 | Ono et al. | |
| 2003/0008447 A1 | 1/2003 | Asayama et al. | |
| 2004/0009111 A1* | 1/2004 | Haga | C30B 15/203 423/328.2 |
| 2004/0194692 A1 | 10/2004 | Nishikawa et al. | |
| 2005/0247259 A1* | 11/2005 | Yoon | C30B 29/06 117/13 |
| 2008/0128851 A1* | 6/2008 | Aga | H01L 21/3226 257/506 |
| 2012/0043644 A1 | 2/2012 | Ono et al. | |
| 2013/0175726 A1 | 7/2013 | Minami et al. | |
| 2016/0042974 A1* | 2/2016 | Ono | H01L 21/3225 257/617 |
| 2016/0322233 A1* | 11/2016 | Nakayama | C30B 29/06 |
| 2017/0253995 A1* | 9/2017 | Qu | C30B 33/02 |

FOREIGN PATENT DOCUMENTS

| | | |
|---|---|---|
| JP | 3626364 B2 | 3/2005 |
| JP | 2007-186376 A | 7/2007 |
| JP | 4102988 B2 | 6/2008 |
| JP | 4224966 B2 | 2/2009 |
| JP | 2012-015298 A | 1/2012 |
| JP | 2012-134517 A | 7/2012 |
| JP | 2013-074139 A | 4/2013 |
| JP | 2013-163598 A | 8/2013 |
| JP | 2013-206981 A | 10/2013 |
| KR | 10-1999-0077707 A | 10/1999 |
| KR | 10-1999-0088462 A | 12/1999 |
| KR | 10-2008-0041128 A | 5/2008 |
| WO | 00/12787 A1 | 3/2000 |
| WO | 01/88230 A1 | 11/2001 |
| WO | 2006/025409 A1 | 3/2006 |

OTHER PUBLICATIONS

Office Action issued in DE Application No. 11 2016 002 091.0, dated Jul. 13, 2018, with English translation.
Notice of Allowance from Korean Application No. 10-2017-7031302 dated Mar. 13, 2018.
Office Action issued in Taiwan Patent Application. No. 105113404, dated Apr. 5, 2017.
Office Action issued in CN Patent Application No. 201680025582.6, dated May 21, 2018, with partial English translation.

* cited by examiner

SILICON EPITAXIAL WAFER AND METHOD OF PRODUCING SAME

TECHNICAL FIELD

The present invention relates to a silicon epitaxial wafer in which a gettering effect is provided while defined oxygen concentration is maintained, and slips do not occur without an increase of an epitaxial defect, and to a technology suitable for a method of producing the silicon epitaxial wafer.

Priority is claimed on Japanese Patent Application No. 2015-095604, filed on May 8, 2015, the content of which is incorporated herein by reference.

BACKGROUND ART

In the related art, in order to prevent a decrease of yield, an epitaxial wafer is produced and the epitaxial wafer is used as a wafer which has intrinsic gettering (IG) capability which can decrease an effect of metal contamination in a device process and the like, and which has no defect in a device region.

Patent Documents 1, 2, 4, and 5 disclose a method of producing an epitaxial wafer, in which nitrogen is doped when silicon single crystal is pulled up and a heat treatment is performed on a wafer sliced from the single crystal.

Patent Document 3 discloses descriptions relating to a control of V/G.

PRIOR ART LITERATURE

Patent Documents

[Patent Document 1] Japanese Patent No. 3626364
[Patent Document 2] Japanese Patent No. 4102988
[Patent Document 3] Japanese Patent No. 4224966
[Patent Document 4] Japanese Unexamined Patent Application, First Publication No. 2004-304095
[Patent Document 5] Japanese Unexamined Patent Application, First Publication No. 2007-186376

DISCLOSURE OF INVENTION

Technical Problem

Recently, a treatment having harsh thermal conditions, such as an annealing in a very short time, has been performed in a device manufacturing process, in accordance with a change of a treatment condition in the device manufacturing process, such as miniaturization of a design rule. Specifically, the treatment is performed at a temperature of 1150° C. to 1200° C. for about 1 millisecond.

A phenomenon of an occurrence of slip which has not previously occurred is emerged with such a drastic change (intensified) thermal condition. It is considered that oxygen precipitates (BMD) density in a bulk influence such the occurrence of slip. In addition, it is considered that it is possible to prevent the occurrence of slip by reducing the BMD density.

Generally, the BMD density is increased as nitrogen concentration becomes higher. Therefore, the inventors attempted to reduce the nitrogen concentration. However, when the nitrogen concentration is decreased, a problem in that the BMD density is decreased too much and sufficient IG capability is not obtained occurs.

Further, concentration of nitrogen to be doped varies between the top side and the tail side of silicon single crystal, since segregation occurs while the silicon single crystal is pulled up. If the nitrogen concentration is increased, not only the BMD density is increased, but also a probability of an occurrence of a lamination defect (epitaxial defect) formed in an epitaxial layer is also increased. Thus, it is necessary that the nitrogen concentration which influences all characteristics is set to be in a constant range, for enabling simultaneously realization of the following points over the full length of a straight body portion used as a wafer: a point of realizing BMD density with sufficient IG capability; a point of no lamination defect (epitaxial defect) formed in an epitaxial layer; and a point of preventing the occurrence of slip. It is very difficult to pull up such silicon single crystal, and realization thereof is not possible.

A heat treatment may be performed before epitaxial growth is caused. If the temperature of the heat treatment is a high temperature, the BMD density is increased. Therefore, it is considered that the BMD density is decreased by changing the heat treatment condition to a low temperature side or by not performing the heat treatment. However, it is not possible to enable simultaneously realization of the above-described points (point of realizing BMD density with sufficient IG capability, a point of no epitaxial defect, and a point of preventing the occurrence of slip) only by changing the condition of the heat treatment.

Considering the above circumstances, the present invention achieves an object of providing a method of producing a silicon epitaxial wafer in which defect density on a surface of an epitaxial layer is equal to or less than 0.01 (pieces/cm$^2$), the number of epitaxial defects is very small, slips do not occur even if annealing is performed for a very short time, and a gettering capability is provided.

Solution to Problem

According to the present invention, there is provided a method of producing a silicon epitaxial wafer in order to solve the above object.

In the method of producing the silicon epitaxial wafer of the present invention, silicon single crystal is pulled up in conditions in which nitrogen concentration of the single crystal is set to be $1 \times 10^{11}$ to $2 \times 10^{13}$ atoms/cm$^3$, oxygen concentration thereof is set to be $9.5 \times 10^{17}$ to $13.5 \times 10^{17}$ atoms/cm$^3$ (ASTM F123-1979), and a crystal cooling rate is about 4.2° C./min at a temperature of a silicon melting point to 1350° C. and is about 3.1° C./min at a temperature of 1200° C. to 1000° C. A heat treatment is performed on a silicon wafer sliced from the silicon single crystal in a treatment condition of 850° C. or higher and lower than 900° C. and about 30 min. Then, an epitaxial layer is formed.

Thus, oxygen precipitate density is set to be $1 \times 10^8$ to $5 \times 10^9$ pieces/cm in a case where a heat treatment for oxygen precipitation evaluation is performed at 780° C. for 3 hours and is performed at 1000° C. for 16 hours.

In the method of producing a silicon epitaxial wafer of the present invention, the oxygen concentration may be set to be high on the top side of the silicon single crystal and to be low on the tail side of the silicon single crystal.

The silicon epitaxial wafer in the present invention is preferably a silicon epitaxial wafer in which oxygen concentration in a silicon wafer is set to be $9.5 \times 10^{17}$ to $13.5 \times 10^{17}$ atoms/cm$^3$ (ASTM F123-1979), oxygen precipitate density in the silicon wafer is $1 \times 10^8$ to $5 \times 10^9$ pieces/cm$^3$ in a case where a heat treatment for oxygen precipitation evaluation is performed at 780° C. for 3 hours and is performed at 1000° C. for 16 hours, and slips do not occur in a case where annealing is performed for a very short time.

In the silicon epitaxial wafer of the present invention, defect density on the surface of the epitaxial layer may be equal to or less than 0.01 pieces/cm².

In the present invention, in the produced epitaxial wafer, it is preferable that the oxygen concentration of the wafer before epitaxial growth is set to be $9.5 \times 10^{17}$ to $13.5 \times 10^{17}$ atoms/cm³. As described above, concentration of nitrogen to be doped varies between the top side and the tail side of the silicon single crystal, since segregation occurs while the silicon single crystal is pulled up. The nitrogen concentration on the top side of the single crystal is low and is increased toward the tail side. However, when the oxygen concentration is adjusted in the above range so as to be high on the top side of the single crystal and to be low on the tail side, the variation of the nitrogen concentration is compensated, and thus it is possible to obtain appropriate oxygen precipitate (BMD) density.

In this state, it is required that the occurrence of slip is prevented, even in a case where an annealing treatment having harsh thermal conditions is performed for a very short time, that is, at a temperature of 1150° C. to 1200° C. for about 1 millisecond. The inventors of this application found not only the BMD density but also a new mechanism regarding the cause of the occurrence of slip. In the new mechanism, a large size BMD is provided in a wafer (bulk) for the annealing for the very short time in the device process, and slips occur from the BMD as a starting point. Therefore, not only the BMD density is decreased so as not to form an epitaxial defect, but also the BMD density sufficient for securing IG capability is maintained and the size thereof is reduced in the new mechanism. In the very short-time annealing which is set as a target in the present invention, a portion of a wafer is heated up to a high temperature for a very short time and then is cooled. Thus, very large thermal stress is applied and thus slips occur in the wafer. The target of the present invention is that thermal stress corresponding to a treatment of the above-described treatment temperature and the above-described treatment time is generated. In the present invention, the treatment temperature and the treatment time are not limited to the above values.

Figure 4A:
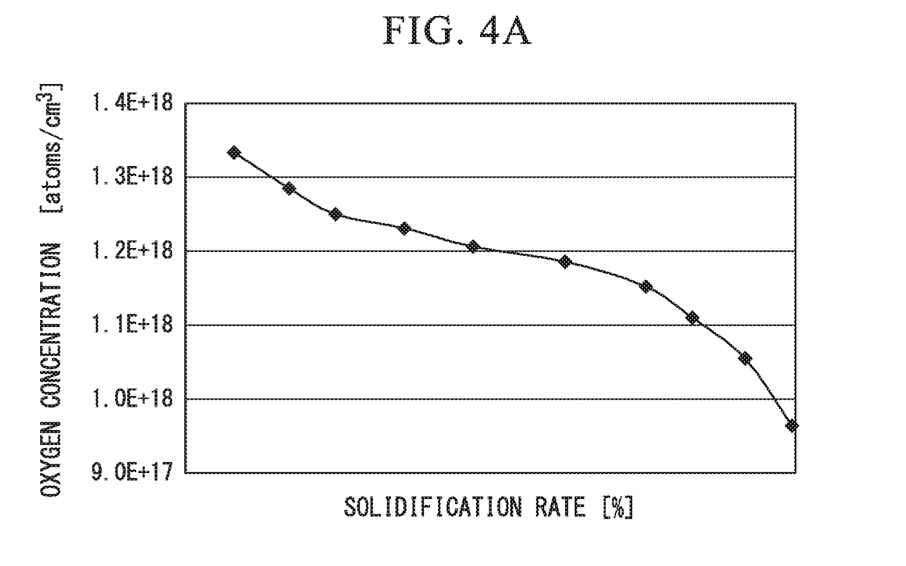
FIG. 4A is a graph showing a change of oxygen concentration with respect to a solidification rate when the silicon single crystal is pulled.
Figure 4B:
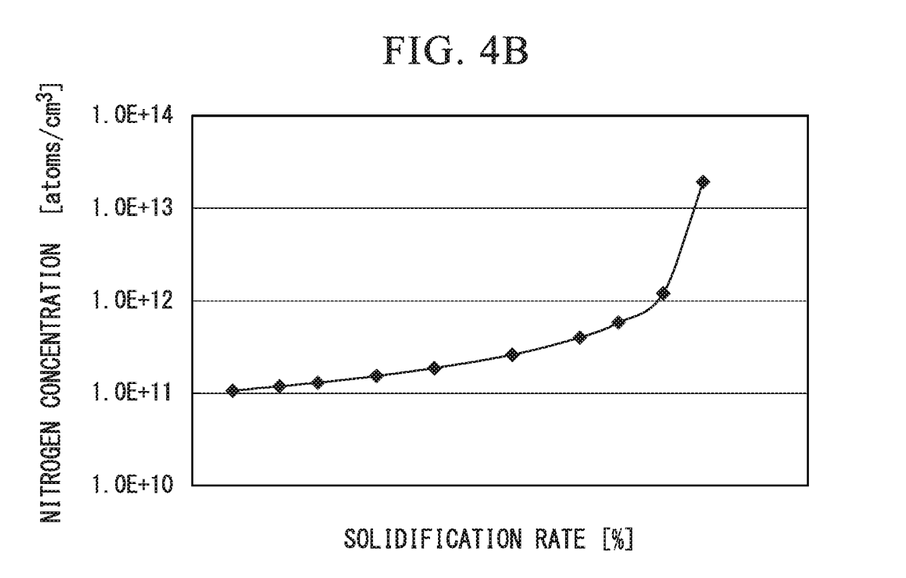
FIG. 4B is a graph showing a change of nitrogen concentration with respect to the solidification rate when the silicon single crystal is pulled.

Here, the nitrogen concentration is decreased, and thus an attempt to reduce the BMD density is performed. Although the BMD density is decreased by decreasing the nitrogen concentration, the BMD density becomes much less than a level of obtaining the sufficient IG effect. As shown in FIG. 4B, doping amount of nitrogen varies depending on the pull-up length by occurrence of segregation, accordingly, the BMD density varies in accordance with the pull-up length. However, it is necessary that this variation of value is caused not to be out of an allowable range. Thus, in order to remain the BMD after an epitaxial growth, as shown in FIG. 4A, the oxygen concentration is set to be high on the top side of the single crystal and is set to be low on the tail side thereof. Simultaneously, thermal history of the single crystal is controlled, and thus vacancy density functioning as the nucleus of the BMD is increased. Therefore, the reduction of the BMD density is compensated. Further, the heat treatment is performed before the epitaxial growth, the treatment temperature is appropriately set, and thus finally, the BMD density is ensured.

In a case (low temperature heat treatment) where the treatment temperature in the heat treatment before the epitaxial growth is set to be lower than 850° C. or the heat treatment is not performed, the BMD density is in a range of about $2 \times 10^7$ to $2 \times 10^9$ pieces/cm³ and the BMD density is in a state of not being controlled. In particularly, if the BMD density is less than about $1 \times 10^8$ pieces/cm³, sufficient gettering capability is not obtained. Thus, it is necessary that a lower limit of the nitrogen concentration is set to be about $2 \times 10^{13}$ atoms/cm³, in order to prevent the decrease of the BMD density. This means that the lower limit of the nitrogen concentration is set because the nitrogen concentration on the top side is particularly less than that on the tail side by the segregation. However, as described above, if the lower limit value of the nitrogen concentration is set, that is, if the nitrogen concentration on the top side is set not to be less than the lower limit value of the BMD density, the nitrogen concentration on the tail side becomes more than that. Thus, since the number of epitaxial defects is increased in the above-described nitrogen concentration, the wafer is not suitable as a wafer for high quality. Conversely, if the nitrogen concentration is decreased, the required BMD density is not obtained and sufficient gettering capability is not obtained.

In a case where, in the heat treatment, the treatment temperature is set to be equal to or higher than 900° C. and thus the gettering capability is imparted, slips occur from the BMD as a starting point by very short-time annealing for corresponding to miniaturization of a device process. With only this condition, it is not possible to perform control to satisfy both the sufficient gettering capability and prevention of the occurrence of slip.

Thus, the inventors of the present invention controlled thermal history of crystal based on an intention of increasing vacancy density which functioned as the nucleus of the BMD. Therefore, the BMD density can be controlled with a factor which is different from the nitrogen concentration, the heat treatment condition, and the oxygen concentration. However, as described above, all the factors have a correlation with each other, and it is not possible to independently change only one factor. Thus, considering the relevance, the best conditions are found.

As the results, in the method of producing the epitaxial wafer in the present invention, the oxygen precipitate (BMD) density can be set to be $1 \times 10^8$ to $5 \times 10^9$ picces/cm³ after performing the heat treatment at 780° C. for 3 hours and the heat treatment at 1000° C. for 16 hours by pulling up silicon single crystal in a state where the nitrogen concentration in the single crystal is set to be $1 \times 10^{11}$ to $2 \times 10^{13}$ atoms/cm³, the oxygen concentration thereof is set to be $9.5 \times 10^{17}$ to $13.5 \times 10^{17}$ atoms/cm³, and the crystal cooling rate is set to be about 4.2° C./min at a temperature of a silicon melting point to 1350° C. and is set to be about 3. ° C./min at a temperature of 1200° C. to 1000° C., performing the heat treatment on a wafer sliced from the silicon single crystal in a treatment condition of 850° C. or higher and lower than 900° C. for about 30 min, and then causing epitaxial layer growth. As a result, it is possible to produce an epitaxial wafer in which slips do not occur even though very short-time annealing is performed, and the defect density on the surface of the epitaxial layer is equal to or less than 0.01 pieces/cm².

Here, regarding the nitrogen concentration, considering segregation, nitrogen doping is performed at a time of pulling so as to cause an upper limit value and a lower limit value of the nitrogen concentration to be in the above range. Doping of nitrogen can be realized by known process, for example, adding a predetermined amount of a nitrogen-containing material at a time of melting a raw material or mixing a nitrogen-containing gas in a pulling atmosphere.

Figure 2:
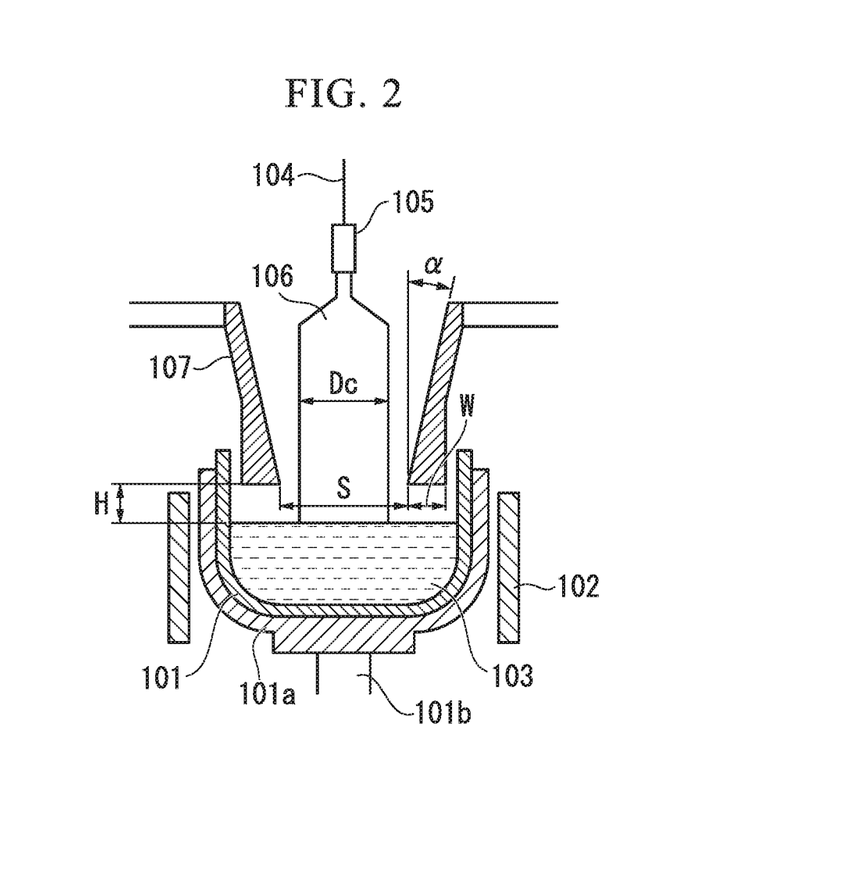
FIG. 2 is a longitudinally section of a CZ furnace used in the embodiment of the method of producing an epitaxial wafer according to the present invention.

Regarding the crystal cooling rate, the cooling rate is controlled respectively at the first temperature from a silicon melting point to 1350° C. and at the second temperature from 1200° C. to 1000° C. In the first temperature, a first part of silicon single crystal solidified from a silicon melt as a raw material, and in the second temperature, the silicon single crystal is cooled further. Thus, the vacancy density and distribution are controlled to be in a desired state. The cooling rate can be controlled by a pulling apparatus in which a hot zone (thermal shield and the like) including temperature control device (heating and cooling device) is provided. For example, a device having a structure as shown in FIG. 2 can be applied.

Here, the cooling rate being about 4.2° C./min at a temperature of the silicon melting point to 1350° C. means that the cooling rate may be in a range of 3.9 to 4.6° C./min and is preferably in a range of 4.0 to 4.4° C./min. When the cooling rate is less than the above range, an epitaxial defect easily occurs on the epitaxial wafer. Thus, this case is not preferable. When the cooling rate is more than the above range, a probability of that pulled crystal is not made to be single crystal and is restored with high probability, and efficiency is bad. Thus, this case is not preferable. Further, this case is not preferable because an appearance of crystal becomes deformed.

The cooling rate being about 3.1° C./min at a temperature of 1200° C. to 1000° C. means that the cooling rate may be in a range of 2.9 to 4.5° C./min and is preferably in a range of 3.0 to 3.5° C./min. In a case of being out of the above range, an epitaxial defect easily occurs on the epitaxial wafer. Thus, this case is not preferable.

The reason of setting the treatment condition in the heat treatment to be 850° C. or higher and lower than 900° C. for about 30 min is because the BMD density for obtaining sufficient IG capability is ensured and a BMD size which causes slip not to occur is obtained.

Here, the value regarding the treatment time set to be about 30 min, that is, the treatment time contains a range having about 10% of width, and specifically, the treatment time set to be 30±3 min (27 to 33 min). In a case where the treatment time is less than this range, it is not possible to ensure sufficient BMD density. In a case where the treatment time is larger than this range, the BMD density is not changed. In a case where the treatment temperature is lower than the above range, it is necessary that the nitrogen concentration is increased in order to obtain BMD density which allows the sufficient IG effect to be obtained. However, this case is not preferable because an epitaxial defect may occur on the epitaxial wafer. In addition, this case is not preferable because BMD density is not stable and control to be in a desired state is not possible. In a case where the treatment temperature is set to be higher than the above range, it is considered that the BMD grows and the size is increased. Slips occur from a BMD having a large size as a starting point, and thus this case is not preferable.

As shown in FIG. 4A, the oxygen concentration of the wafer can be changed in accordance with a solidification rate of single crystal at a time of being pulled. In this case, the oxygen concentration is controlled by setting a rotation state of a crucible and single crystal and a pulling atmosphere condition when the single crystal is pulled. As a result, the oxygen concentration is set to be in a range of $9.5 \times 10^{17}$ to $13.5 \times 10^{17}$ atoms/cm$^3$. Furthermore, not only other conditions are set at a time of pulling the single crystal and at the time of the heat treatment, but also a delicate adjustment of the BMD density, which is affected according to a change of the above-described nitrogen concentration, is performed by controlling the oxygen concentration. At this time, the oxygen concentration is set to not be out of the above range.

In the method of producing a silicon epitaxial wafer of the present invention, the oxygen concentration may be set to be high on the top side of the silicon single crystal and to be low on the tail side of the silicon single crystal.

The growth of an epitaxial film in the present invention can be performed in a normal condition. For example, an epitaxial layer having a film thickness of about 1 to 7 μm is grown by supplying a film forming gas such as trichlorosilane under reduced pressure in a temperature condition of about 1300° C.

In the present invention, after the heat treatment for oxygen precipitation evaluation is performed at 780° C. for 3 hours and is performed at 1000° C. for 16 hours, the BMD density can be set to be $1 \times 10^8$ to $5 \times 10^9$ pieces/cm$^3$, since the above all the treatment conditions are satisfied.

Accordingly, it is possible to produce an epitaxial wafer in which slips do not occur even though very short-time annealing is performed, and the defect density on the epitaxial surface is equal to or less than 0.01 pieces/cm$^2$.

The very short-time annealing in this case means a treatment which is performed at a temperature of 1150° C. to 1200° C. for about 1 millisecond or a thermally harsh treatment which is comparable in heat conditions to the above conditions of the treatment. Here, about 1 millisecond means 0.7 to 1.1 milliseconds.

Slips not occurring means that slip defects having a size of 0.1 mm or more are not provided on the surface of a wafer in visual examination of an image captured by using an X-ray. At this time, determination is performed by using an image which is enlarged in a microscope at about ×10 and ×30.

Advantageous Effects of Invention

According to the present invention, since all the above conditions are satisfied, an effect in that it is possible to provide an epitaxial wafer which has sufficient gettering capability and in which slips do not occur even though very short-time annealing is performed and a state of reducing epitaxial defects is maintained can be exhibited.

BEST MODE FOR CARRYING OUT THE INVENTION

Hereinafter, an embodiment of a method of producing an epitaxial wafer according to the present invention will be described with reference to the drawings.

Figure 1:
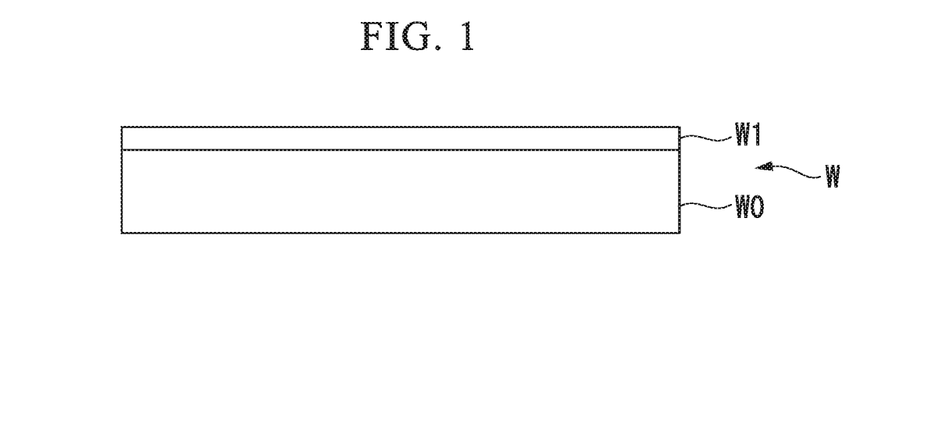
FIG. 1 is a sectional view showing a silicon epitaxial wafer in an embodiment of a method of producing an epitaxial wafer according to the present invention.

FIG. 1 is a sectional view showing a silicon epitaxial wafer in the embodiment. In FIG. 1, the reference sign of W indicates a silicon epitaxial wafer.

The silicon epitaxial wafer W according to the embodiment is applied to, for example, a semiconductor element such as a MOS and a memory. As shown in FIG. 1, an epitaxial layer W1 is formed on a wafer W0 sliced from silicon single crystal which has been pulled up by a CZ method. Thus, oxygen concentration in a bulk is set to be in a range of $9.5 \times 10^{17}$ to $13.5 \times 10^{17}$ atoms/cm$^3$, the number of epitaxial defects on the surface of the epitaxial layer W1 is set to be equal to or less than 0.01 pieces/cm$^2$, and slips do not occur even though very short-time annealing is performed.

Regarding the method of producing a silicon wafer, firstly, as a process of pulling silicon single crystal, polysilicon which is a raw material of silicon crystal is laminated and disposed in a quartz crucible. Then, a CZ crystal is pulled up in an Ar atmosphere or in a predetermined atmosphere in which a predetermined gas such as hydrogen is contained. The CZ crystal is the name of a crystal which also includes magnetic field applied CZ crystal and is produced by a Czochralski method (CZ method).

At this time, as a nitrogen-added silicon single crystal, silicon single crystal is pulled while a compound including nitrogen is added at a stage of a raw material so as to obtain predetermined nitrogen concentration or is pulled in an atmosphere in which nitrogen is provided. Simultaneously, a predetermined amount of a dopant is added into the raw material in accordance with a type of a set substrate, for example, if the substrate is a p-type, B (boron) is used as the dopant. When pulling is performed, the oxygen concentration of single crystal is controlled by setting the atmosphere gas type, the flow rate, pressure, the rotation speed of the crucible and the single crystal, and the like.

Pulling of nitrogen-added CZ silicon single crystal will be described below. A wafer having a size of φ300 mm to φ450 mm will be described, but the present invention is not limited thereto.

FIG. 2 is a longitudinally sectional view of a CZ furnace applied for describing producing of silicon single crystal in the embodiment. The CZ furnace includes a crucible (quartz crucible) 101 and a heater 102. The crucible 101 is disposed at the center portion of a chamber. The heater 102 is disposed on the outside of the crucible 101. The crucible 101 has a double structure in which the quartz crucible 101 that accommodates a raw material melt 103 and is on the inside thereof is held by a graphite crucible 101a on the outside thereof. The crucible 101 is driven to be rotated and lifted by a support shaft 101b called as a pedestal. A cylindrical thermal shield 107 is provided over the crucible 101. The thermal shield 107 has a structure in which a shell is made of graphite, the inside thereof is filled with graphite felt, and temperature control device is provided. The temperature control device (not shown) has a cooling device configured by a water cooling pipe and the like and has a heating device such as a heater.

For example, in a case of pulling for a wafer having a size of φ300 mm, the CZ furnace in which a single crystal having a size of φ300 mm can be grown is used, for example, an aimed diameter is 310 mm and a body length is 1200 mm in the single crystal.

Next, a method of setting an operation condition for growing CZ silicon single crystal will be described.

Firstly, polycrystal of high-purity silicon is loaded in the crucible. For example, boron (B) as a dopant is added to cause resistivity of crystal to have a p-type.

In the present invention, the p type or the p-type indicates a wafer having boron (B) concentration which corresponds to resistivity of 1 to 100 Ωcm. A p+ type indicates a wafer having boron concentration which corresponds to resistivity of 0.1 Ωcm to 1 Ωcm. An n type or an n-type indicates a wafer having phosphorus (P) concentration which corresponds to resistivity of 1 to 100 Ωcm. An n+ type indicates a wafer having phosphorus concentration which corresponds to a resistivity of 0.1 Ωcm to 1 Ωcm.

A p/p-type means a wafer in which a p-type epitaxial layer is laminated on a p-type substrate (wafer). A p/n-type means a wafer in which a p-type epitaxial layer is laminated on an n-type substrate.

Figure 3:
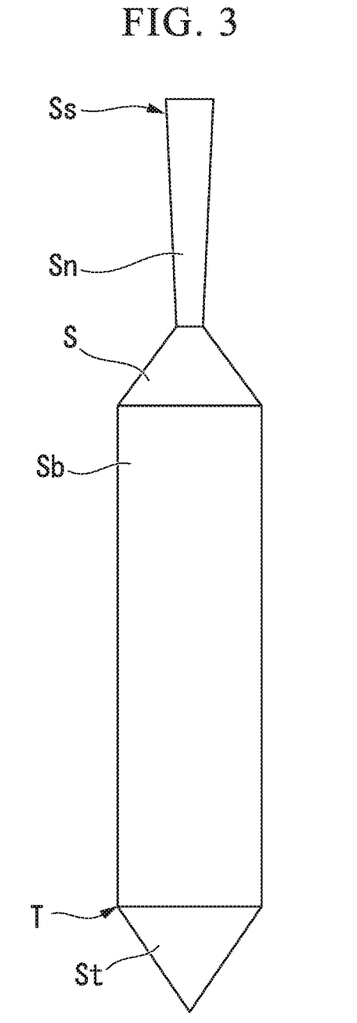
FIG. 3 is a front view schematically showing a silicon single crystal in the embodiment of the method of producing an epitaxial wafer according to the present invention.

FIG. 3 is a front view schematically showing silicon single crystal in the embodiment.

In the embodiment, in the CZ furnace shown in FIG. 2, so as to satisfy the nitrogen concentration to be in a range of $1 \times 10^{11}$ to $2 \times 10^{13}$ atoms/cm$^3$ in the silicon single crystal, pulling is performed while a predetermined amount of a nitrogen-containing material is added to a silicon melted liquid when a raw material is melted, or the silicon single crystal is pulled in an atmosphere in which a nitrogen-containing gas is mixed.

Here, in a case where the nitrogen concentration is set to be more than an upper limit value of the above range, a BMD level at which the occurrence of slip during very short-time annealing is caused is obtained. Thus, this case is not preferable. In a case where the nitrogen concentration is set to be less than a lower limit value of the above range, a BMD level at which obtaining a sufficient IG effect is not possible is obtained. Thus, this case is not preferable.

The crystal rotation speed, the crucible rotation speed, the heating condition, an applied magnetic field condition, a pulling rate, and the like are controlled to set initial oxygen concentration in the silicon single crystal to be $9.5 \times 10^{17}$ to $13.5 \times 10^{17}$ atoms/cm$^3$ (ASTM F123-1979).

Then, silicon is heated and melted by the heater 102, and thereby a melt 103 is obtained. Then, seed crystal Ss attached to a seed chuck 105 is immersed in the melt 103 and crystal pulling is performed while the crucible 1 and a pull-up shaft 4 are rotated. A crystal orientation is set to be any of {100}, {111}, or {110}. If necessary for no crystal dislocation, a neck portion Sn is formed by seed drawing (necking), and then a shoulder portion S is formed. Thus, the diameter is extended and thus, for example, an aimed body diameter of 310 mm is obtained.

Then, a body portion Sb is formed to grow up to, for example, 1200 mm at a constant pulling rate. A tail portion St is formed by reducing the diameter in a predetermined condition, and tail drawing is performed. Then, crystal growth is ended. Here, the pulling rate V is appropriately selected in accordance with the resistivity, the diameter size of silicon single crystal, a hot zone structure (thermal environment) of a single-crystal pulling device to be used, and the like.

In the embodiment, in a region corresponding to a body portion (straight body portion) Sb, the crystal cooling rate is set to be about 4.2° C./min at a temperature from the silicon melting point to 1350° C. and is set to be about 3.1° C./min at a temperature from 1200° C. to 1000° C. That is, in a time just after solidification, which is a time when vacancies functioning as a nucleus of a BMD is formed, and in a period having a temperature range when vacancies distribution state is formed in single crystal by pair annihilation between vacancy and interstitial silicon, pulling conditions are controlled. Accordingly, a growth condition of a crystal including vacancy is controlled, and thus crystal characteristics which influence epitaxial defect density, the occurrence of slip in very short-time annealing, and the degree of obtaining the IG capability are controlled.

Specifically, control may be performed by changing a distance H from the melt to the thermal shield 107. The temperature control device configured from the cooling device or the heating device can be also used. As described above, a temperature state of single crystal is controlled and the pulling rate is controlled, and thus the above conditions are realized.

At this time, the temperature of the pulling furnace can be obtained by simulation with analysis software such as FEMAG In the embodiment, as described above, the addition of nitrogen is performed with controlling the pulling condition when the straight body portion is pulled up, and these processes are combined with a heat treatment (which will be described later). Thus, with synergy effect of these process, when an epitaxial layer is grown on the wafer, BMD density can be controlled such that the occurrence of the epitaxial defect on the surface thereof, the occurrence of slip in the very short-time annealing, and gettering capability are in predetermined ranges over the full length of the straight body portion as each wafer cutting position. That is, a silicon single crystal having such desired quality can be pulled up. And then, working efficiency can be improved and the cost of producing a silicon single crystal or a silicon epitaxial wafer produced from the silicon single crystal can be significantly reduced.

Subsequent to the process of pulling silicon single crystal, as a wafer machining process, machining of the nitrogen-added CZ silicon single crystal is performed, and thus, as shown in FIG. 1, the silicon wafer W0 which includes nitrogen is obtained.

In the wafer machining process, a general method of machining the silicon wafer W0 is used. Specifically, after slicing of the silicon single crystal is performed by a cutting device such as an ID saw or a wire saw, chamfering and the like are performed. A silicon wafer obtained thereby is annealed. Then, a surface treatment process such as polishing and washing is performed on the surface thereof. For example, as the wafer machining process, the surface of the silicon substrate W0 which is the nitrogen-added CZ silicon single crystal is mirror-finished, and then, for example, RCA washing obtained by combining SC1 and SC2 is performed. Various processes such as lapping, cleaning, and grinding are performed in addition to the above processes. The processes are appropriately changed and used (for example, an order of the processes is changed or some processes are omitted) in accordance with the purpose.

In the silicon wafer W0 obtained in this manner, the nitrogen concentration is $1 \times 10^{11}$ to $2 \times 10^{13}$ atoms/cm$^3$ and the oxygen concentration is $9.5 \times 10^{17}$ to $13.5 \times 10^{17}$ atoms/cm$^3$ (ASTM F123-1979).

Since nitrogen in a solid solution state is contained in silicon, introduction of nitrogen is performed in a form in which nitrogen in a silicon lattice is substituted with silicon. That is, since an atomic radius of nitrogen is smaller than that of a silicon atom, in a case where nitrogen is coordinated at a substitution position, a stress field of crystal functions as a compressive stress field. Thus, oxygen and impurities between lattices are easily captured to the compressive stress field. An oxygen precipitate which is stable at a high temperature and has high density is exhibited from the substitution-position nitrogen as the starting point in as-grown. In addition, the high gettering effect is easily imparted to the silicon substrate W0.

The concentration of nitrogen added in the silicon is required to be restricted to be in the above-described range. The reason is as follows. When the nitrogen concentration is less than the above range, acceleration of forming a nitrogen and oxygen-based precipitate is not active. Thus, it is not possible to realize forming of the nitrogen and oxygen-based precipitate having the above-described sufficient density.

If the nitrogen concentration is more than the above range, a BMD distribution state, which is a not-preferable state where slips occur in the very short-time annealing and an epitaxial defect occurs, is obtained.

Further, the oxygen concentration Oi of the silicon substrate W0 is required to be in the above range. The reason is as follows. When the oxygen concentration Oi is less than the above range, forming a nitrogen and oxygen-based precipitate is not accelerated and a precipitate having high density is not obtained. Thus, it is not possible to obtain the required gettering capability.

If the oxygen concentration Oi is more than the above range, the precipitate is formed too much. Thus, there is a probability of the precipitate functioning as a source of slip occurrence.

Then, as the heat treatment, a heat treatment is performed at a temperature of 850° C. or higher and lower than 900° C. under an atmosphere of an inert gas for about 30 min.

Here, the value regarding the treatment time set to be about 30 min, that is, the treatment time contains a range having about 10% of width, and specifically, the treatment time set to be 30±3 min (27 to 33 min). In a case where the treatment time is less than this range, it is not possible to ensure sufficient BMD density. In a case where the treatment time is larger than this range, the BMD density is not changed. In a case where the treatment temperature is lower than the above range, it is necessary that the nitrogen concentration is increased in order to obtain the BMD density for obtaining sufficient IG capability. However, in this case, an epitaxial defect may occur on the epitaxial wafer. Thus, this case is not preferable. In addition, the case is not preferable because BMD density is not stable and control to be in a desired state is not possible. In a case where the treatment temperature is set to be higher than the above range, the BMD density is too high and slips occur from a BMD as the starting point. Thus, this case is not preferable.

Then, in an epitaxial layer forming process, loading the silicon substrate in an epitaxial growth furnace is performed in order to grow an epitaxial layer. As shown in FIG. 1, for example, an epitaxial layer W1 in which dopant concentration has a p type is grown by using various CVD methods (chemical vapor deposition method).

As an epitaxial process, the epitaxial layer W1 is formed in an atmosphere of, for example, trichlorosilane, dichlorosilane, or the like as a film forming gas, a dopant gas, and hydrogen as a carrier gas. The epitaxial layer W1 is formed in a temperature condition of about 1100° C. to 1200° C. The formed epitaxial layer W1 has a film thickness of 1 to 10 μm and preferably about 1 to 3μ or about 3 to 5 μm. After or before the epitaxial process, a surface treatment may be performed in an atmosphere in which a HCl gas or the like is included.

After that, a heat treatment is performed at 780° C. for 3 hours and a heat treatment for oxygen precipitation evaluation is performed at 1000° C. for 16 hours.

According to the embodiment, the nitrogen concentration and the oxygen concentration of crystal are set to be in the above-described state, and the cooling rate of crystal is set to be in the above-described state in a temperature range of the silicon melting point to 1350° C. and in a temperature range of 1200° C. to 1000° C. In this state, silicon single crystal is pulled up. After the heat treatment having the above treatment condition is performed on a wafer sliced from the silicon single crystal, epitaxial layer growth is performed. Thus, the BMD density, after the heat treatment for oxygen precipitation evaluation is performed at 780° C. for 3 hours and is performed at 1000° C. for 16 hours, is set to be $1\times10^8$ to $5\times10^9$ pieces/cm$^3$.

That is, all the conditions are satisfied, and thus it is possible to produce an epitaxial wafer in which slips do not occur even though very short-time annealing is performed, and the defect density on the epitaxial surface is equal to or less than 0.01 pieces/cm$^2$.

In the present invention, the nitrogen concentration has a value obtained by calculation. The concentration below the measurement limit ($1\times10^{14}$ atoms/cm$^3$) of a secondary ion mass spectrometer (SIMS) can be calculated by using a segregation coefficient k ($k=7\times10^{-4}$) obtained from the nitrogen concentration which indicates a certain solidification rate and which is measured in a range of the measurement limit or higher of the SIMS. That is, a value which is calculated by a general segregation expression: $C_{TOP}=C_X(1-X)^{l-k}$ (Here, $C_{TOP}$ indicates the nitrogen concentration on the top side, $C_X$ indicates the nitrogen concentration measured at a solidification rate X by the SIMS) or a value which is calculated by $C_{TOP}=kC_0$ ($C_0$ indicates the amount of nitrogen put into, for example, a wafer having a nitride film attached thereto when the raw material is melted) is used as the calculated nitrogen concentration.

In the present invention, "the single crystal top" means a start of pulling a straight body portion which is used for slicing a wafer. "The single crystal tail" means an end of pulling the straight body portion which is used for slicing a wafer.

Slip not occurring means that a slip defect having a size of about 0.1 mm or 0.1 mm or more is not provided on the surface of a wafer in visual examination of an image captured by using an X-ray. At this time, determination is performed by using an image which is enlarged in a microscope at about ×10 and ×30.

Regarding measurement of an epitaxial defect, the density of defects having a size of 0.01 μm or more was determined by using a laser light scattering type particle counter (SP1 (surfscan SP1): manufactured by KLA-Tencor Corporation).

The BMD density is measured in a manner as follows. A sample is etched in a dash solution (3.2±5% of hydrofluoric acid, 16.5±5% of nitric acid, 69.2±5% of glacial acetic acid, 0.005% of a silver nitrate aqueous solution, and 11±5% of pure water) by 5 μm. The sample after etching is cleaved and an oxygen precipitate in a cross section is measured.

EXAMPLE

An example of the present invention will be described below.

As the pulling condition, silicon single crystal having φ310 mm and a length of 1200 mm was pulled in a state where the nitrogen concentration at crystal top was set. Here, a cooling rate in the temperature range of the silicon melting point to 1350° C. and the temperature range of 1200° C. to 1000° C. and the initial oxygen concentration (at a time of pulling) in a straight body portion were controlled.

The surface of a wafer sliced from single crystal was mirror-polished. After a heat treatment was performed at 875° C. or another temperature for 30 min, epitaxial growth was performed in an atmosphere in which a trichlorosilane gas was contained, in a condition of 1300° C. for 30 sec. Thus, a p-type epitaxial layer having a film thickness of 3 μm was formed on the wafer. Density of epitaxial defects occurring on the surface of the epitaxial layer was measured with respect to a distance in an axial direction. Regarding measurement of an epitaxial defect, the density of defects (SF) having a size of 0.01 μm or more was determined by using a laser light scattering type particle counter (SP1 (surfscan SP1): manufactured by KLA-Tencor Corporation). Further, the BMD density after the heat treatment for oxygen precipitation evaluation was performed at 780° C. for 3 hours and was performed at 1000° C. for 16 hours was evaluated.

Further, after very short-time annealing was performed at a temperature of 1150° C. to 1200° C. for about 1 millisecond, it was determined whether or not slip occurred in an image captured by using an X-ray.

Tables show the results.

TABLE 1

|  | Experimental Example 1 | Experimental Example 2 | Experimental Example 3 | Experimental Example 4 | Experimental Example 5 | Experimental Example 6 |
| --- | --- | --- | --- | --- | --- | --- |
| Crystal nitrogen concentration [atoms/cm$^3$] | 1.0E+11 | 2.0E+13 | 3.0E+12 | 6.0E+12 | 3.0E+12 | 4.0E+11 |
| Crystal thermal history [° C./min] Silicon melting point to 1350° C. | 4.2 | 4.2 | 4.2 | 4.2 | 4.2 | 4.2 |
| Crystal thermal history [° C./min] 1200° C. to 1000° C. | 3.1 | 3.1 | 3.1 | 3.1 | 3.1 | 3.1 |
| Oxygen concentration E17 [atoms/cm$^3$] | 13.5 | 9.5 | 12.8 | 12.0 | 10.5 | 12.0 |
| Heat treatment temperature [° C.] | 875 | 875 | 875 | 875 | 875 | 875 |
| BMD density [/cm$^3$] | 6.2E+08 | 3.0E+09 | 2.0E+09 | 5.0E+09 | 1.0E+08 | 4.8E-08 |
| Epitaxial defect [/cm$^2$] | 0.004 | 0.010 | 0.006 | 0.007 | 0.006 | 0.000 |
| Slip | None | None | None | None | None | None |

TABLE 2

|  | Experimental Example 7 | Experimental Example 8 | Experimental Example 9 | Experimental Example 10 | Experimental Example 11 | Experimental Example 12 | Experimental Example 13 |
| --- | --- | --- | --- | --- | --- | --- | --- |
| Crystal nitrogen concentration [atoms/cm$^3$] | 1.0E+12 | 1.0E+2 | 5.0E+13 | 2.0E+13 | 1E+2 | 5E+12 | ND (None Dope) |
| Crystal thermal history [° C./min] Silicon melting point to 1350° C. | 4.2 | 2.9 | 4.2 | 2.9 | 4.2 | 4.2 | 4.2 |
| Crystal thermal history [° C./min] 1200° C. to 1000° C. | 3.1 | 2.1 | 3.1 | 2.1 | 3.1 | 3.1 | 3.1 |

TABLE 2-continued

|  | Experimental Example 7 | Experimental Example 8 | Experimental Example 9 | Experimental Example 10 | Experimental Example 11 | Experimental Example 12 | Experimental Example 13 |
|---|---|---|---|---|---|---|---|
| Oxygen concentration E17 [atoms/cm$^3$] | 13.5 | 13.5 | 12.0 | 12.6 | 10 | 12.4 | 13.5 |
| Heat treatment temperature [° C.] | 650 | 875 | 875 | 875 | 900 | 840 | 875 |
| BMD density [/cm$^3$] | 1.0E+07 | 5.0E+07 | 1.0E+09 | 7.0E+09 | 5.0E+09 | 8.00E+07 | 4.00E+07 |
| Epitaxial defect [/cm$^2$] | 0.005 | 0.005 | 0.020 | 0.020 | 0.015 | 0.005 | 0.001 |
| Slip | None | None | None | Presence | Presence | None | None |

From the results, in Experimental Examples 1 to 6, all the conditions in the present invention are satisfied. Thus, it is understood that the BMD density is in the predetermined range, epitaxial defects are equal to or less than the reference value, and slips do not occur. On the contrary, the BMD density is small in Experimental Examples 7 and 8. Thus, it is understood that it is not possible to show the sufficient gettering capability. It is understood that the number of formed epitaxial defects is more than the defined amount in Experimental Example 9. It is understood that the occurrence of slip is observed in Experimental Example 10. It is understood that the heat treatment temperature is too high and the number of formed epitaxial defects is more than the defined amount in Experimental Example 11. In Experimental Example 12, the heat treatment temperature is too low and the BMD density is small. Thus, it is understood that it is not possible to show the sufficient gettering capability. In Experimental Example 13, doping is not performed and the BMD density is small. Thus, it is understood that it is not possible to show the sufficient gettering capability.

REFERENCE SIGNS LIST

W . . . SILICON EPITAXIAL WAFER
W0 . . . WAFER
W1 . . . EPITAXIAL LAYER

What is claimed is:

1. A method of producing a silicon epitaxial wafer, comprising:

pulling up a silicon single crystal;
slicing the silicon single crystal to form a silicon wafer;
heating the silicon wafer for 27 to 33 minutes at a temperature of 850° C. or higher and lower then 900° C.; and
forming an epitaxial layer on the silicon wafer,
wherein during the pulling up the silicon single crystal, nitrogen concentration of the single crystal is set to be $1\times10^{11}$ to $2\times10^{13}$ atoms/cm$^3$, oxygen concentration of the single crystal is set to be $9.5\times10^{17}$ to $13.5\times10^{17}$ atoms/cm$^3$ (as measured according to ASTM F123-1979), a crystal cooling rate is set to be 3.9 to 4.6 ° C./min at a temperature of a silicon melting point to 1350° C. and is set to be about 2.9 to 4.5° C./min at a temperature of 1200° C. to 1000° C., and
wherein after the epitaxial layer is formed on the silicon wafer, the silicon wafer has an oxygen precipitate density $1\times10^8$ to $5\times10^9$ oxygen precipitates/cm$^3$ when an oxygen precipitation evaluation is performed on the silicon wafer that comprises heating the silicon wafer at 780° C. for 3 hours and then at 1000° C. for 16 hours.

2. The method according to claim 1, wherein the oxygen concentration is set to be higher on a top side of the silicon single crystal than on a tail side of the silicon single crystal.

3. A silicon epitaxial wafer, comprising:

a silicon wafer and
an epitaxial layer formed on a surface of the silicon wafer, wherein:
the silicon wafer has an oxygen concentration of $9.5\times10^{17}$ to $13.5\times10^{17}$ atoms/cm$^3$ (as measured according to ASTM F123-1979),
the silicon wafer has an oxygen precipitate density of $1\times10^8$ to $5\times10^9$ oxygen precipitates/cm$^3$ when an oxygen precipitation evaluation is performed on the silicon wafer that comprises heating the wafer at 780° C. for 3 hours then at 1000° C. for 16 hours, and
slips do not occur after annealing of the silicon wafer is performed for a short time of about 1 millisecond.

4. The silicon epitaxial wafer according to claim 3, wherein a defect density on a surface of the epitaxial layer is equal to or less than 0.01 defects/cm$^2$.

* * * * *